United States Patent
Itai

(10) Patent No.: US 7,449,832 B2
(45) Date of Patent: Nov. 11, 2008

(54) ORGANIC ELECTROLUMINESCENCE DEVICE AND ORGANIC ELECTROLUMINESCENCE DISPLAY

(75) Inventor: Yuichiro Itai, Kawasaki (JP)

(73) Assignee: Fuji Photo Film Co., Ltd., Minami-Ashigara-shi, Kanagawa (JP)

( * ) Notice: Subject to any disclaimer, the term of this patent is extended or adjusted under 35 U.S.C. 154(b) by 589 days.

(21) Appl. No.: 11/062,492

(22) Filed: Feb. 23, 2005

(65) Prior Publication Data

US 2005/0142384 A1 Jun. 30, 2005

Related U.S. Application Data

(63) Continuation of application No. PCT/JP03/04225, filed on Apr. 2, 2003.

(51) Int. Cl.
*H01J 1/62* (2006.01)
*H01J 63/04* (2006.01)

(52) U.S. Cl. ................. 313/504; 313/505; 313/506
(58) Field of Classification Search .......... 313/498–512
See application file for complete search history.

(56) References Cited

U.S. PATENT DOCUMENTS 5,343,050 A * 8/1994 Egusa et al. ............... 257/40
6,392,250 B1 5/2002 Aziz et al.
6,392,339 B1 * 5/2002 Aziz et al. ................. 313/504

FOREIGN PATENT DOCUMENTS

| EP | 1 017 118 A2 | 7/2000 |
|---|---|---|
| JP | 4-297076 | 10/1992 |
| JP | 04-363892 A | 12/1992 |
| JP | 6-36877 | 2/1994 |
| JP | 6-314594 | 11/1994 |
| JP | 2000-196140 | 7/2000 |
| JP | 2002-175887 | 6/2001 |
| JP | 2001-357975 | 12/2001 |
| JP | 2002-507830 | 3/2002 |

OTHER PUBLICATIONS

C.W. Tang et al., "Organic Electroluminescent Diodes", Applied Physics Letters vol. 51, Sep. 21, 1987, pp. 919-915.
Office Action mailed Apr. 15, 2008 in Corresponding Japanese Patent Application No. 2004-570541.

* cited by examiner

*Primary Examiner*—Nimeshkumar D. Patel
*Assistant Examiner*—Thomas A Hollweg
(74) *Attorney, Agent, or Firm*—Westerman, Hattori, Daniels & Adrian, LLP.

(57) ABSTRACT

An organic electroluminescence device is disclosed. The device includes an anode, a cathode formed above the anode, a light-emitting layer containing an organic light-emitting material that is formed between the anode and the cathode, a hole-injecting layer on the anode that includes a hole-transporting material and an acceptor, and an electron-transporting suppressing stack between the hole-injecting layer and the light-emitting layer. The electron-transporting suppressing stack consists of multiple carrier-transporting layers, and forms energy barriers relative to electrons flowing from the light-emitting layer to the hole-injecting layer.

12 Claims, 8 Drawing Sheets

FIG.6

| LAYER MATERIAL | ELECTRON AFFINITY Ea(eV) | ENERGY GAP Eg(eV) | IONIZING POTENTIAL Ip(eV) |
|---|---|---|---|
| 2-TNATA LAYER | 2.19 | 3.00 | 5.19 |
| α-NPD LAYER | 2.42 | 3.04 | 5.46 |
| Alq3 LAYER | 3.07 | 2.71 | 5.78 |
| TYE-704 LAYER | 2.97 | 2.76 | 5.73 |

FIG.7

| | FIRST EXAMPLE | FIRST COMPARATIVE EXAMPLE | SECOND COMPARATIVE EXAMPLE | THIRD COMPARATIVE EXAMPLE |
|---|---|---|---|---|
| HOLE-TRANSPORTING-SUPPRESSING LAYER | α-NPD / 2-TNATA / α-NPD | α-NPD | α-NPD | α-NPD |
| HOLE-INJECTING LAYER | 2-TNATA: F4-TCNQ (0.1vol%) | 2-TNATA | 2-TNATA: F4-TCNQ (0.1vol%) / 2-TNATA | 2-TNATA: F4-TCNQ (0.1vol%) |
| CURRENT DENSITY (A/m²) | 352.8 | 105.6 | 476.7 | 412.1 |
| LIGHT-EMITTING LUMINESCENCE (cd/m²) | 1203 | 207 | 1230 | 1224 |
| LIGHT-EMITTING EFFICIENCY (cd/A) | 3.41 | 1.96 | 2.58 | 2.97 |
| LIGHT-EMITTING EFFICIENCY (lm/W) | 1.07 | 0.62 | 0.81 | 0.93 |

ORGANIC ELECTROLUMINESCENCE DEVICE AND ORGANIC ELECTROLUMINESCENCE DISPLAY

CROSS-REFERENCE TO RELATED APPLICATION

This application is a U.S. continuation application filed under 35 USC 111(a) claiming benefit under 35 USC 120 and 365(c) of PCT application JP2003/004225, filed Apr. 2, 2003. The foregoing applications are hereby incorporated herein by reference.

BACKGROUND OF THE INVENTION

1. Field of the Invention

The present invention generally relates to a technology for a photoelectronic device and a flat-panel display using a photoelectronic device, and particularly relates to an organic electroluminescence device and an organic electroluminescence display.

2. Description of the Related Art

In recent years, there has been a gradual shift in market needs from a conventional large and weighty CRT (a Braun tube) display to a thin and light-weight flat display. As for flat displays, LCD displays and plasma displays have been brought to commercial use as household television sets and PC monitors, etc.

Recently and continuing, attention is being given to an electroluminescence display (below called "EL display") and, more specifically, an organic EL display, as a next-generation flat display. Since a report on a stacking device with hole-transporting and electron-transporting organic thin-films (C. W Tang and S. A. Van Slyke, Applied Physics Letters vol. 51, 913 (1987)), an organic EL device for the organic EL display has attracted attention as a large-area light-emitting device for emitting light at a low voltage, not more than 10 volts, and is being studied actively.

A stacking organic EL device basically has a configuration of an anode, a hole-transporting layer, a light-emitting layer, an electron-transporting layer, and a cathode. Of these, the electron-transporting layer, as in the case of the double-layer device of Tang and Van Slyke as described above, is configured such that the light-emitting layer also serves the function of the electron-transporting layer. For the anode, electrode materials having a large work function such as gold (Au), tin oxide ($SnO_2$), and Indium Tin Oxide (ITO) are being used. Moreover, for the cathode, metals Li and Mg having a low work function with a small barrier for injecting the electrons into the electron-transporting layer, or their alloys Al—Li and Mg—Ag, etc., are being used.

Using various organic EL device structures and organic materials up to now has produced a luminance of about 1,000 $cd/m^2$ at a light-emitting voltage of 10 volts in the early stage of use. However, continuously driving the organic EL device over time results in a decreased light-emitting luminance and an increased drive voltage, eventually causing a short circuit.

It is considered that degradations of the organic EL device are due to crystallization over time of organic materials, the associated accumulation of space charges within the organic layer, and polarization due to applying the electric field in a certain direction, causing organic molecules to polarize the electrodes so as to change the electric characteristic of the device, or degradations due to oxidization of the electrodes, etc. Moreover, when there is high power consumption, it is possible that the energy lost that changes to heat helps to degrade the organic material. Therefore, to increase the life of the device, desirably a highly-efficient device from which a high light-emitting luminance can be obtained at as low a current and voltage as possible should be implemented.

Thus, to achieve the high efficiency as described above, attempts are being made to increase the durability with a study in terms of materials and a method of driving the EL device. For example, as disclosed in JP06-036877A, a method is proposed that alternately repeats stacking of two types of organic layers for forming light-emitting layers such as to have energy bands of well-type potentials, so that electrons and holes not rebonding in one light-emitting layer rebond in the next light-emitting layer to emit light, thus increasing the light-emitting efficiency. However, with this configuration, a decreased voltage at each organic layer and generated Joule heat due to the high-resistance characteristics of the organic layers lead to a decrease in the light-emitting efficiency and the service life of the organic EL device.

In order to resolve this problem, as disclosed in JP04-297076A, a proposal is made for doping with acceptors within the hole-transporting layer to enhance conductivity.

In this case, while it is possible that the conductivity can be enhanced to increase the amount of hole current and the amount of electron current, as the carriers are not enclosed sufficiently, a problem arises such that the power consumption increases and the light-emitting efficiency and the service life decrease. Here, it is considered that as the electron affinity of the acceptors is generally greater than that of hole-injecting-transporting materials, decreasing the energy barrier at the interface of the hole-transporting layer and the light-emitting layer, which energy barrier encloses electrons within the light-emitting layer, makes efficient enclosing of electrons within the light-emitting layer not possible, causing the light-emitting efficiency to decrease.

As means for resolving this problem, as disclosed in JP2000-196140, a method is proposed for forming an electron-injecting suppressing layer that encloses electrons between the light-emitting layer and the hole-transporting layer, thus increasing the light-emitting efficiency. While there is less decrease in the light-emitting efficiency for a case of forming the electron-injecting suppressing layer than for a case of the hole-transporting layer directly bordering on the light-emitting layer, there is a problem that electrons that can pass through the electron-injecting-suppressing layer exist. While it is possible to increase the thickness of the electron-injecting suppressing layer so as to suppress such electrons as described above, at the same time, the flow of holes is suppressed, causing the luminance to decrease, so that there is yet to be a solution having satisfactory EL characteristics.

Patent Document 1

JP2000-196140A

SUMMARY OF THE INVENTION

It is a general object of the present invention to provide a technology for a photoelectronic device and a flat-panel display using a photoelectronic device that substantially obviates one or more problems caused by the limitations and disadvantages of the related art.

It is a more particular object of the present invention to provide an organic electroluminescence device and an organic electroluminescence display that have superior light-emitting efficiency and a long service life.

According to the invention, an organic electroluminescence device includes an anode, a cathode formed above the anode, a light-emitting layer containing an organic light-emitting material that is formed between the anode and the cathode, a hole-injecting layer on the anode that contains a hole-transporting material and an acceptor, and an electron-transporting suppressing stack between the hole-injecting layer and the light-emitting layer, wherein the electron-transporting suppressing stack consists of multiple carrier-transporting layers, and forms energy barriers relative to electrons flowing from the light-emitting layer to the hole-injecting layer.

The organic electroluminescence device as described above has superior light-emitting efficiency and a long service life.

Other objects and further features of the present invention will become apparent from the following detailed description when read in conjunction with the accompanying drawings.

BRIEF DESCRIPTION OF THE DRAWINGS

FIG. 6 is a table illustrating the characteristic values of the electron-transporting suppressing layer, the hole-injecting layer, and the light-emitting layer used for the organic EL devices according to examples according to the present invention and comparative examples;

FIG. 7 is a table illustrating the layer configuration of specific elements of organic EL devices according to a first example, and first through third comparative examples.

DETAILED DESCRIPTION OF THE PREFERRED EMBODIMENTS

In the following, embodiments of organic EL devices according to the present invention are described with reference to the accompanying drawings.

A First Embodiment

Figure 1:
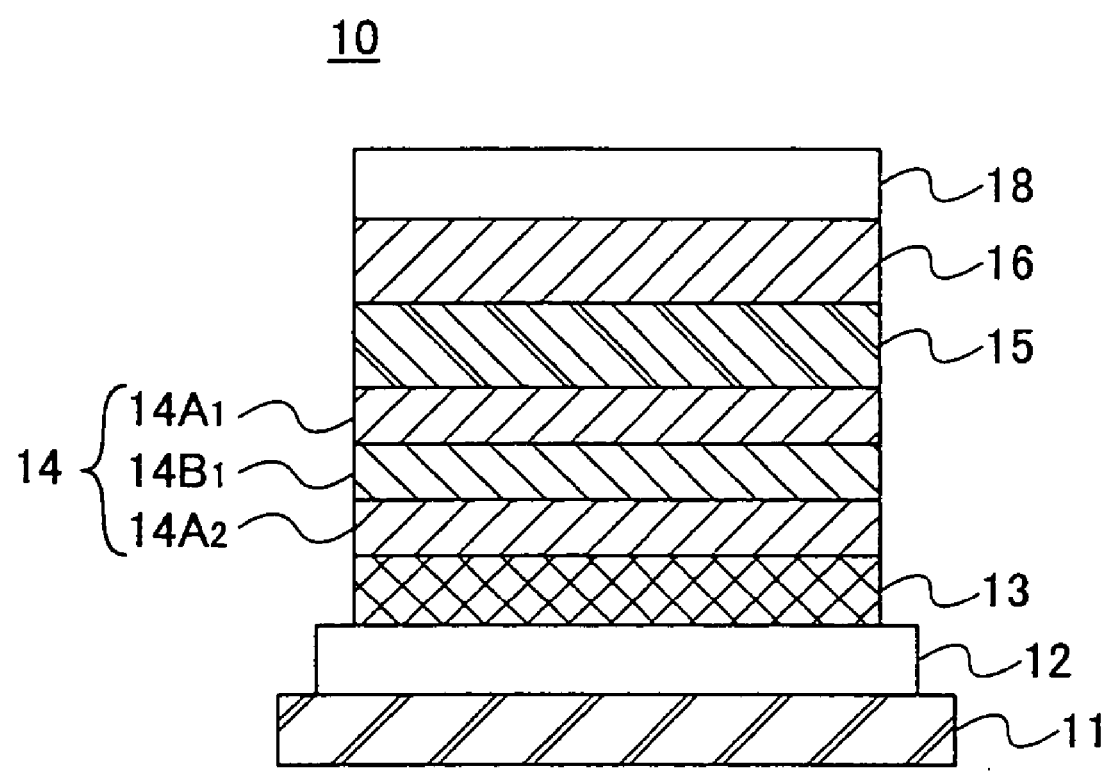
FIG. 1 is a cross-sectional view of an organic EL device according to a first embodiment of the present invention.
Figure 2:
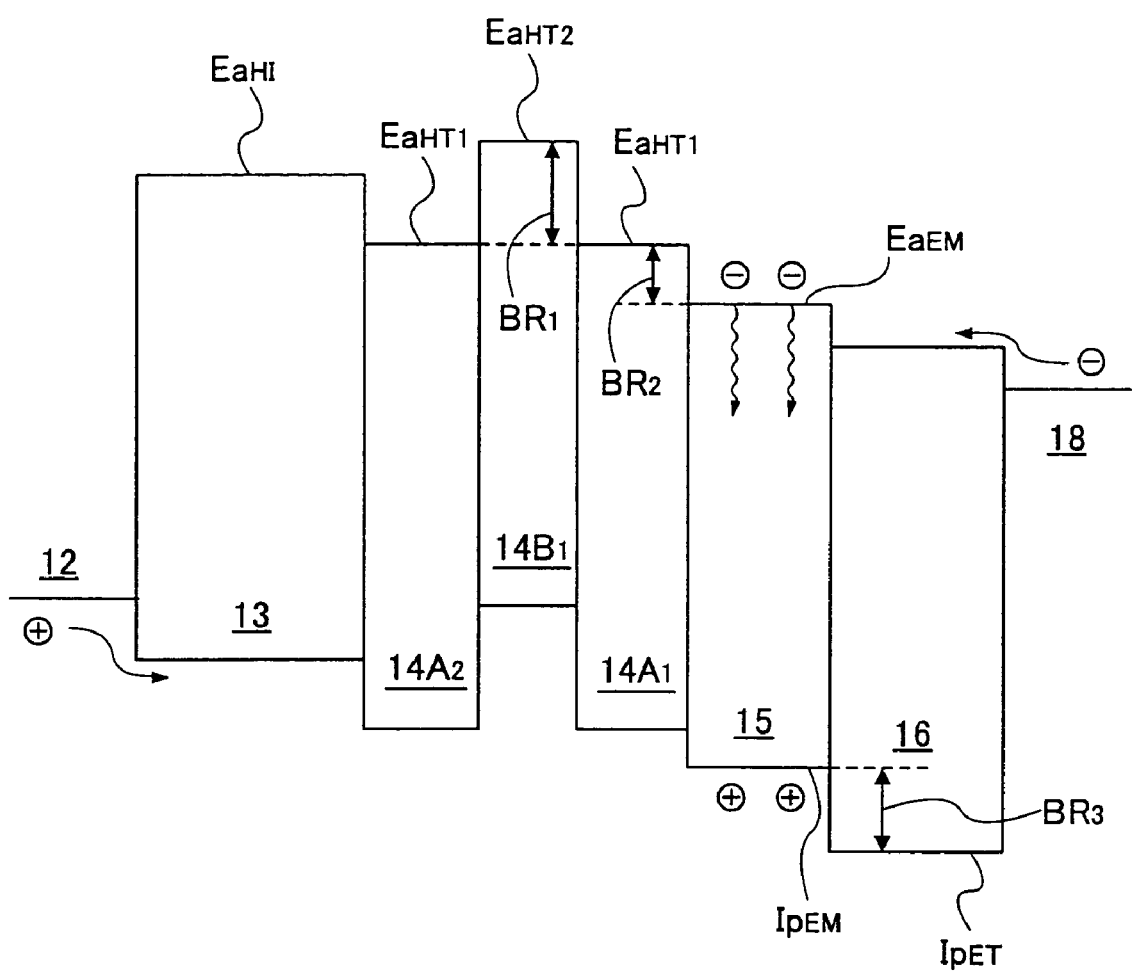
FIG. 2 is an energy diagram of the organic EL device according to the first embodiment.

FIG. 1 is a cross-sectional view of an organic EL device according to the first embodiment of the present invention. FIG. 2 is an energy diagram of the organic EL device according to the first embodiment as illustrated in FIG. 1. In FIG. 2, Ea denotes the electron affinity and Ip denotes the ionizing potential. Referring to FIGS. 1 and 2, an organic EL device 10 is configured with a substrate 11, an anode 12, a hole-injecting layer 13, an electron-transporting suppressing stack 14, a light-emitting layer 15, an electron-transporting layer 16 and a cathode 18 that are sequentially formed on the substrate 11.

The organic EL device 10 of the present invention has the hole-injecting layer 13 composed of a hole-transporting material that is doped with acceptors. The hole-injecting layer 13 is, for example 2-TNATA(4,4',4"-tris(2-naphthylphenylanimo)triphenylamine), a hole-transporting material doped with inorganic materials such as halogen metal compounds, halogens, and platinum-group element metals, or organic materials having a cyano group or a nitro group as acceptors.

More specifically, as a hole-transporting material a known material may be used. Moreover, as preferable acceptors, the halogen metal compounds include $FeCl_3$, $InCl_3$, $AsF_6$, etc., the halogens include Cl, Br, I, etc., and the platinum-group element metals include Au, Pt, W, Ir, etc. Furthermore, as preferable acceptors, the organic materials having a cyano group include TCNQ(7,7,8,8,tetracyanoquinonedi-methane), F4-TCNQ(2,3,5,6-tetrafluoro-7,7,8,8,tetracyanoquinonedimethane), TCNE(tetracyanoethylene), etc., and the organic materials having a nitro group include TNF(trinitrofluorenone) and DNF(dinitrofluorenone), etc. Of these, TCNQ, F4-TCNQ, TCNE, TNF, and DNF are especially preferable.

The content of the acceptors in the hole-injecting layer 13 is set at 0.01 vol. % to 2.0 vol. %, preferably at 0.05 vol. % to 1.0 vol. %, relative to hole-transporting materials (100 vol. %). Below 0.01 vol. %, the conductivity does not increase, while above 2.0 vol. %, the amount of current increases, causing the power consumption to increase. More specifically, when using F4-TCNQ as the acceptors, the content of the acceptors is preferably at 0.05 vol. % to 1.0 vol. %.

The hole-injecting layer 13 may be formed using such vacuum processes as vacuum deposition, CVD and sputtering, or such wet processes as spin coating and printing.

The organic EL device of the present invention is provided with the electron-transporting suppressing stack 14 between the hole-injecting layer 13 and the light-emitting layer 15. The electron-transporting suppressing stack 14 is formed sequentially stacked from the light-emitting layer 15 side toward the hole-injecting layer 13, by a first electron-transporting suppressing layer $14A_1$, a second electron-transporting suppressing layer $14B_1$, and a first electron-transporting suppressing layer $14A_2$. The first electron-transporting suppressing layers $14A_1$ and $14A_2$, and the second electron-transporting suppressing layer $14B_1$ that are composed from hole-transporting materials are arranged such that energy barriers are formed relative to the electrons from the light-emitting layer 15 side to the hole-injecting layer 13 side.

The first electron-transporting suppressing layers $14A_1$ and $14A_2$, and the second electron-transporting suppressing layer $14B_1$ preferably have a relationship as represented in Equation (1) below:

$$E_{aHT1} > E_{aHT2} \tag{1}$$

Here, $E_{aHT1}$ is the electron affinity of the first electron-transporting suppressing layers $14A_1$ and $14A_2$, while $E_{aHT2}$ is the electron affinity of the second electron-transporting suppressing layer $14B_1$. As the second electron-transporting suppressing layer $14B_1$ for which the amount of the electron affinity is larger relative to the first electron-transporting suppressing layers $14A_1$ and $14A_2$ is formed between the two first electron-transporting suppressing layers $14A_1$ and $14A_2$, an energy barrier $BR_1$ is formed relative to the electrons at the interface from the first electron-transporting suppressing layers $14A_1$ to the second electron-transporting suppressing layer $14B_1$. Thus, the amount of electron current from the light-emitting layer 15 to the hole-injecting layer 13 is reduced.

Moreover, in addition, the light-emitting layer 15 and the first electron-transporting suppressing layer $14A_1$ preferably have a relationship as represented in Equation (2) below:

$$E_{aHT1} < E_{aEM} \tag{2}$$

Here, $E_{aEM}$ is the electron affinity of the light-emitting layer 15, while $E_{aHT1}$ is the electron affinity of the first electron-transporting suppressing layer $14A_1$. Also an energy barrier BR$_2$ is formed at the interface between the light-emitting layer 15 and the first electron-transporting suppressing layer 14A$_1$ so that the electrons are enclosed in the light-emitting layer 15. It is noted that the probability of electrons crossing the energy barrier BR$_2$ is high with the first electron-transporting suppressing layer 14A$_1$ being only one layer, and increasing the thickness of the first electron-transporting suppressing layer 14A$_1$ in order to reduce such probability as described above causes a large voltage drop that is not desirable in terms of durability. Moreover, such measure as described above may cause a decrease in the amount of hole-electron current. Thus, providing at the anode side of the light-emitting layer 15 the electron-transporting suppressing stack 14, which consists of multiple first and second electron-transporting suppressing layers and which has multiple energy barriers BR$_1$ and BR$_2$, effectively suppresses the amount of electron current proceeding from the light-emitting layer 15 toward the hole-injecting layer 13 and increases the space-electron density in the light-emitting layer 15 so as to increase the light-emitting efficiency.

Below, a specific configuration of the organic EL device according to the present embodiment is described.

For the substrate 11, what may be used are, for instance, such transparent base materials as glass, quartz, etc., such semiconductor substrates as Si, etc., such films as PET and PEN, etc., and such resin substrates as PVA. Or TFTs (Thin-Film Transistors) for controlling on and off of the organic EL device may be formed in a matrix shape on these substrates. The thickness of the substrate 11 that is selected accordingly depending on the materials of the substrate 11 is approximately 0.1 mm to 10 mm.

The anode 12 is formed on the substrate 11 by deposition or sputtering from conducting materials such as Al, and preferably such materials as Au, Cr, etc., which have a large work function are used from the hole-injection performance point of view. It is noted that when light is irradiated from the anode side, the anode 12 is formed from transparent materials such as ITO and IZO (Indium-Zinc-Oxide).

As hole-transporting materials for the hole-injecting layer 13, the first electron-transporting suppressing layer 14A, and the second electron-transporting suppressing layer 14B, materials having a high HOMO, or a small ionizing potential are used. Representative materials include copper phthalocyanin (CuPc), starburst amine m-MTDATA, 2-TNATA, TPD, α-NPD, etc.

It is noted that the ionizing potentials of the first electron-transporting suppressing layer 14A and the second electron-transporting suppressing layer 14B preferably are roughly equal from the point of view of increasing the amount of hole current. The energy barriers may be formed low relative to the holes, suppressing the amount of electron current without inhibiting the flow of hole current.

Moreover, a further non-acceptor containing hole-injecting layer may be provided between the hole-injecting layer 13 and the anode 12. The further hole-injecting layer which is to made to be a thin layer relative to the hole-injecting layer 13 is composed from a material having an ionizing potential that is almost equal to the size of the work function of the anode 12. Such measure as described above facilitates the flow of hole current.

For the light-emitting layer 15, such metal complex-based materials as Alq3(tris(8-hydroxyquinolio)aluminum), Znq2, Balq2, and such pigment-based materials such as PZ10 and EM2 may be used. Moreover, host materials such as Alq3 that are doped with such pigments as Levulan and TPB may be used.

For the electron-transporting layer 16, 8-hydrooxyquinoline metal chelates, metal thioxynoid compounds, oxadiazole metal chelates, triazine, 4,4'-bis(2,2-diphenyl vinyl)biphenyl, etc., may be used. Preferred 8-hydrooxyquinoline metal chelates include Alq3, Balq(bis(8-hydroxynolate)-(4-phenylphenolate)aluminum), bis-PBD, etc. Moreover, preferred metal thioxynoid compounds include bis(8-quinolinethiolate)zinc, bis(8-quinolinethiolate)cadmium, tris(8-quinolinethiolate)gallium, tris(8-quinolinethiolate indium), etc. Furthermore, preferred oxadiazole metal chelates include bis(2-(2-hydroxylphenyl)-5-phenyl-1,3,4-oxyadiazolate)zinc, bis-(2-(2-hydroxylphenyl)-5-phenyl-1,3,4-oxyadiazolate) beryllium, bis(2-(2-hydroxylphenyl)-5-(1-naphthyl)-1,3,4-oxyadiazolate)zinc, bis(2-(2-hydroxylphenyl)-5-(1-naphthyl)-1,3,4-oxyadiazolate)beryllium, etc.

For the cathode 18, metals such as Li and their alloys Mg—Ag, Al—Li, etc., that have a small work function are used. Moreover, a cathode that introduces an electron-injecting layer of metal fluorides, etc., such as LiF/Al may be used.

As illustrated in FIG. 2, the electrons tend to flow from the light-emitting layer 15 towards the hole-injecting layer 13. However, the energy barrier BR$_1$ is formed at the interface between the first electron-transporting layer 14A$_1$ and the second electron-suppressing layer 14B$_1$ due to the difference in the electron affinities of these two layers $E_{aHT1}$–$E_{aHT2}$. Hereby the flow of electrons is prevented and the amount of electron current is suppressed, enclosing the electrons in the light-emitting layer 15. Moreover, the energy barrier BR$_2$ is formed at the interface between the light-emitting layer 15 and the first electron-trasnporting layer 14A$_1$ due to the difference in the electron affinities of these two layers $E_{aEM}$–$E_{aHT1}$. Hereby furthermore the electrons are enclosed in the light-emitting layer 15. Thus the space-electron density of the light-emitting layer 15 is increased, increasing the probability of rebonding with the holes.

In the organic EL device of the present embodiment, the ionizing potentials of the electron-transporting layer 16 bordering the cathode 18 side of the light-emitting layer 15 and of the light-emitting layer 15 preferably have a relationship as represented in Equation (4) below:

$$I_{pEM} < I_{pET} \tag{4}$$

Here, in the Equation (4), $I_{pEM}$ is the ionizing potential of the light-emitting layer 15, $I_{pET}$ is the ionizing potential of the electron transporting layer 16 as described above, the ionizing potentials being represented as the difference (a positive value) between the valence electron level (the energy at the upper end of the valence-electron band) and the vacuum level. Providing an energy barrier BR$_3$ at the cathode 18 side of the light-emitting layer 15 encloses the holes in the light-emitting layer 15. Such measure as described above increases the space-hole density, increasing the probability of rebonding with electrons.

Figure 3:
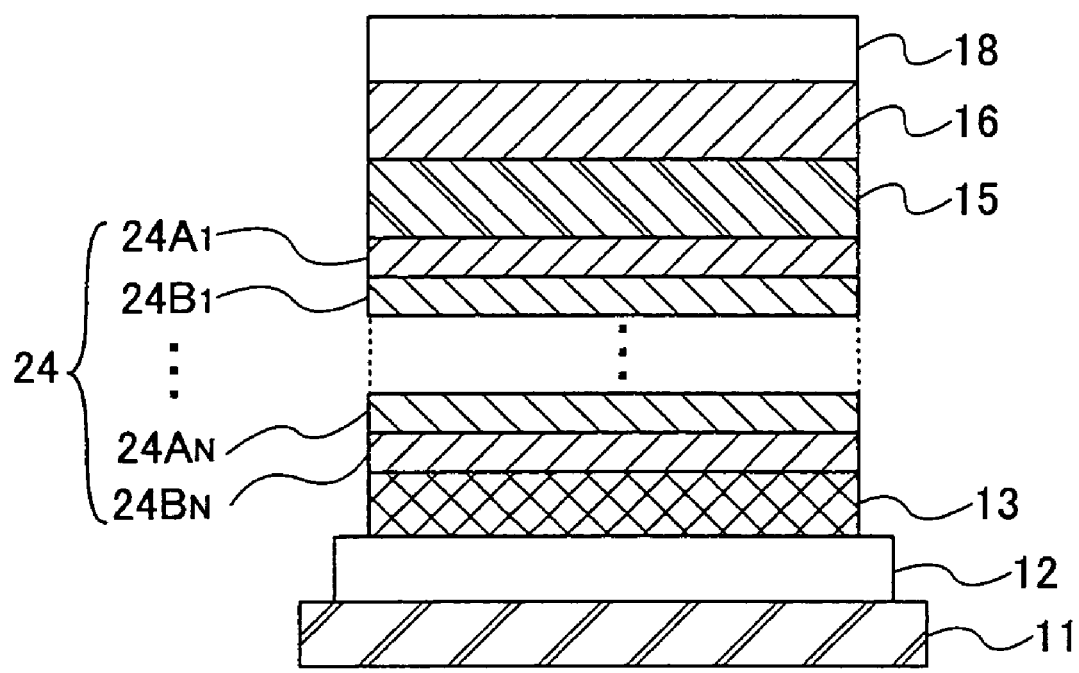
FIG. 3 is a cross-sectional view of the organic EL device according to a variation of the first embodiment of the present invention.

FIG. 3 is a cross-sectional view of the organic EL device according to a variation of the present embodiment. In the figure, those parts corresponding to the parts described previously are given the same reference letters so as to abbreviate the descriptions.

Referring to FIG. 3, an organic EL device 20 of the present variation is configured with a substrate 11, and an anode 12, a hole-injecting layer 13, an electron-transporting suppressing stack 24, a light-emitting layer 15, an electron-transporting layer 16, and a cathode 18 that are sequentially formed on the substrate 11. The electron-transporting suppressing stack 24 is composed from a first set of a first electron-transporting suppressing layer 24A$_1$ and a second electron-transporting suppressing layer 24B$_1$ to an N-th set of the first electron-transporting suppressing layer $24A_N$ and the second electron-transporting suppressing layer $24B_N$. Here, the number of sets to be stacked N is an integer no less than 2, and the N-th set may be formed with only the first electron-transporting suppressing layer $24A_N$.

For a larger number of sets to be stacked N, the first electron-transporting suppressing layer 24A and the second electron-transporting suppressing layer 24B are set to be thin. The total thickness of the electron-transporting suppressing stack 24 preferably is set at 150 nm to 500 nm. Setting the total thickness as described above 500 nm results in a large electric resistance, making it not possible to put through the current sufficiently, and applying a high voltage causes the service life of the organic EL device 20 to be reduced. Furthermore, setting the total thickness as described below 150 nm makes it not possible to sufficiently suppress the amount of electron current flowing from the light-emitting layer 15 side to the hole-injecting layer 13.

More specifically, the thickness of each of the first electron-transporting suppressing layers 24A and the second electron-transporting suppressing layers 24B is set at 2 nm to 50 nm, and more preferably at 2 nm to 20 nm. Making the first electron-transporting suppressing layers 24A and the second electron-transporting suppressing layers 24B thin encloses the electrons in the light-emitting layer 15 and prevents blocking the flow of holes.

According to the present variation, providing the electron-transporting suppressing stack 24 with a large number of sets each consisting of a first electron-transporting-suppressing layer 24A and a second electron-transporting suppressing layer 24B and thus with a large number of energy barriers relative to the electrons suppresses more reliably the flow of electrons and prevents blocking the flow of holes.

It is noted that the electron-transporting suppressing stacks 14 and 15 in the organic EL devices 10 and 20 according to the first embodiment and the variation as described above, are composed of two types of electron-transporting suppressing layers, but may be composed of three or more types of electron-transporting suppressing layers. For example, using a third electron-transporting suppressing layer as well as the first and second electron-transporting suppressing layers, from the light-emitting layer 15 side to the hole-injecting layer 13, the layers are set in the order of the first electron-transporting suppressing layer/the second electron-transporting suppressing layer/the first electron-transporting suppressing layer/the second electron-transporting suppressing layer/the third electron-transporting suppressing layer/the first electron-transporting suppressing layer. The relationship among the electron affinities of the three types of the electron-transporting suppressing layers is set as represented in Equation (5) below:

$$E_{aHT1} > E_{aHT2} > E_{aHT3} \quad (5)$$

Here, in the Equation (5), $E_{aHT1}$ is the electron affinity of the first electron-transporting suppressing layer, $E_{aHT2}$ is the electron affinity of the second electron-transporting suppressing layer, and $E_{aHT3}$ is the electron affinity of the third electron-transporting suppressing layer. Forming relative to the electrons an energy barrier at the interface of the second electron-transporting suppressing layer and the third electron-transporting suppressing as well as an energy barrier at the interface of the first electron-transporting suppressing layer and the second electron-transporting suppressing layer, thus forming within the electron-transporting suppressing stack energy barriers having different sizes, enhances the suppressibility of the flow of electrons.

Moreover, the first electron-transporting suppressing layer 14A or the second electron-transporting suppressing layer 14B bordering the cathode 18 side of the hole-injecting layer 13 preferably has a relationship as represented in Equation (3) below:

$$E_{aHT} > E_{aHI} \quad (3)$$

Here, in Equation (3), $E_{aHT}$ is the electron affinity of the first or the second carrier transporting layer bordering the cathode 18 side of the hole-injecting layer 13, and $E_{aHI}$ is the electron affinity of the hole-injecting layer 13. Providing an energy barrier at a location prior to the electrons reaching the hole-injecting layer 13 when flowing from the light-emitting layer 15 side to the hole-injecting layer 13 suppresses the flow of electrons.

It is noted that in the present embodiment, the energy gap, the ionizing potential, and the electron affinity of each of the electron-transporting suppressing layers 14A, 14B, 24A, 24B, the light-emitting layer 15, and the electron-transporting layer 16, etc., were derived according to those measurement conditions and measurement methods as described below.

As for the energy gap Eg, the light-absorption spectrum was measured, setting the energy at the long-wavelength end of the light-absorption spectrum as the energy gap Eg. More specifically, under the same conditions as the conditions for forming each layer of the organic EL devices as described above, a particular one of the electron-transporting layers, etc., to be measured was individually formed at a thin film having a thickness of 50 nm. Using a spectrophotometric apparatus (manufactured by Hitachi, Co. Ltd., product name: Spectrophotometer-U-4100), ultra-violet to visible light was irradiated on a thick film in the atmosphere and the light-absorption spectrum (the wavelength dependency) was measured.

Figure 4:
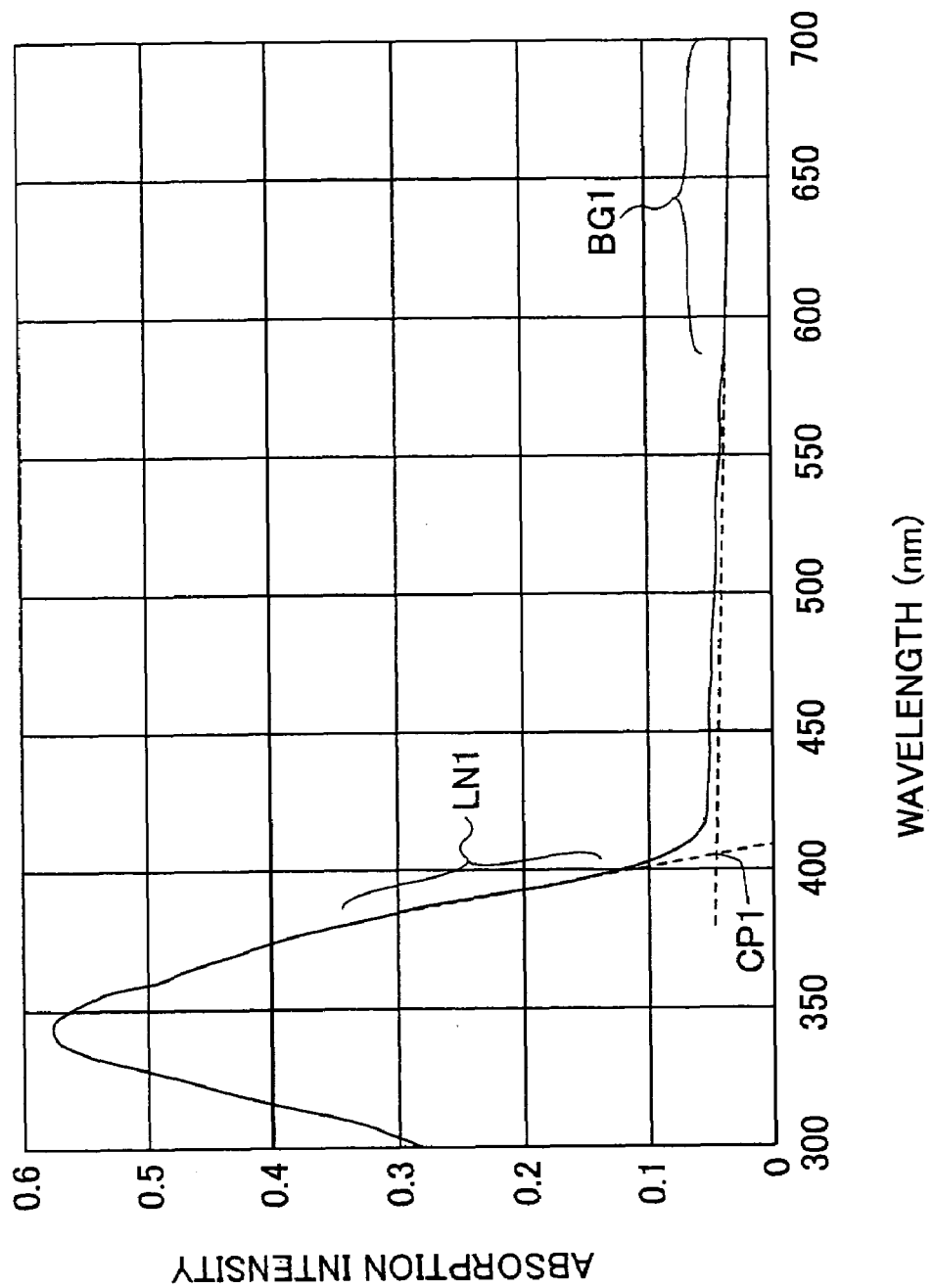
FIG. 4 is a graph for describing a method of deriving energy gaps.

FIG. 4 is a characteristic diagram illustrating the light-absorption spectrum. Referring to FIG. 4, a point of intersection CP1 of a straight line extrapolated to the long-wavelength side using a straight-line approximation of a straight-line segment LN1 at the foot of the long-wavelength side of the light-absorption spectrum, and a straight line extrapolated to the short-wavelength side using a straight-line approximation of a straight-line segment BG1 at the background is converted to the energy gap Eg.

As for the ionizing potential Ip, the photoelectron-emission energy threshold measured using an ultra-violet photoelectron spectroscopy was set to be the ionizing potential Ip. More specifically, using a thick film formed in the same manner as the thick film used for measuring the energy gap Eg, with an ultra-violet photoelectron spectroscopic apparatus (manufactured by Riken Keiki Co., Ltd., product name: AC-1), the ultra-violet light was irradiated on a thin film in the atmosphere and the number of photoelectrons emitted was measured, so as to make a derivation from the relationship between the incident ultra-violet light energy and the number of photoelectrons. The measurement conditions were such that the energy range of the incident ultra-violet light was at 3.8 to 6.2 eV and the ultra-violet light intensity was at 20 nW.

Figure 5:
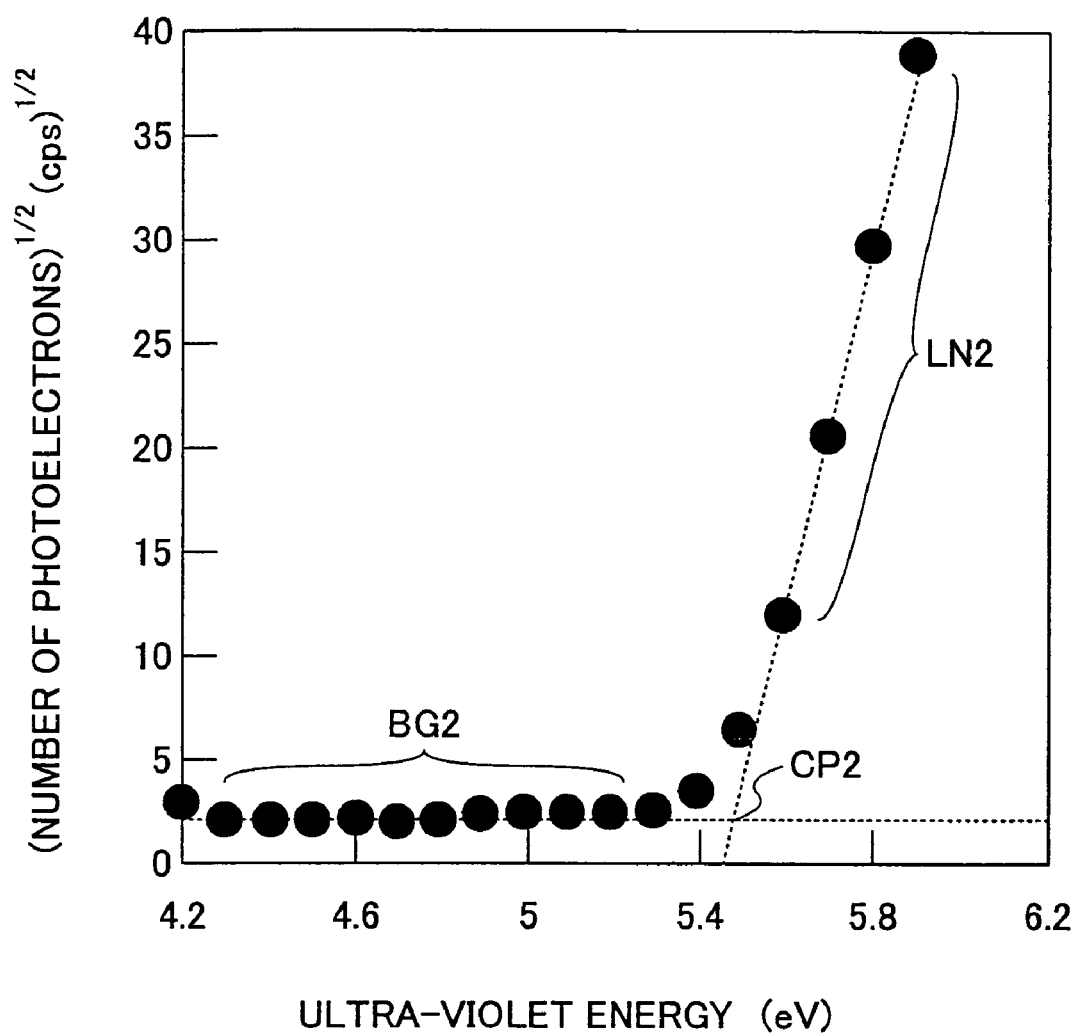
FIG. 5 is a graph for describing a method of deriving ionizing potentials.

FIG. 5 is a characteristic diagram illustrating an example of the relationship between the square root of the number of photoelectrons and the incident ultra-violet light energy. Referring to FIG. 5, the energy at a point of intersection CP2 of a straight line extrapolated to the low-energy side using a straight-line approximation of a straight-line segment LN2 at the rise of the characteristic line, and a straight line extrapolated to the high-energy side using a straight-line approximation of a straight-line segment BG2 at the background is set as the ionizing potential Ip.

Moreover, the electron affinity Ea is derived as the difference between the ionizing potential Ip derived as described above and the energy gap Eg.

Using these methods, the energy gap, the ionizing potential, and the electric affinity are measured for the individual hole-transporting materials, so that combinations of the first and second electron-transporting suppressing layers and the light-emitting layer configuring the electron-transporting suppressing stack can be selected.

FIG. 6 is a table illustrating the measured values of the energy gap, the ionizing potential, and the electron affinity of the electron-transporting suppressing layer, the hole-injecting layer, and the light-emitting layer which configure the organic EL devices of examples according to the present invention and of comparative examples not in accordance with the present invention.

A FIRST EXAMPLE

The organic EL device according to the present example is composed from an ITO anode, a hole-injecting layer, an electron-transporting suppressing stack consisting of three electron-transporting suppressing layers, a light-emitting layer, and a cathode that are formed on a transparent substrate.

A glass substrate with an ITO electrode is supersonically cleansed with water, acetone, and isopropylalcohol, and the surface of the anode is irradiated with UV light in the atmosphere for 20 minutes so as to perform a UV ozone process. Then using a vacuum-deposition apparatus with a vacuum of $1 \times 10^{-6}$ torr and a substrate temperature at 20° C., 2-TNATA and F4-TCNQ as the hole injecting layers are simultaneously deposited at the respective deposition rate of 0.5 nm/s and 0.0005 nm/s and are each set to have the thickness of 120 nm. In other words, with 2-TNATA being 100 vol. %, the content of F4-TCNQ was set at 0.1 vol. %.

Then, the electron-transporting suppressing stack consisting of three layers is formed. $\alpha$-NPD is formed at the deposition rate of 0.1 nm/s and the thickness of 10 nm, followed by 2-TNATA at the deposition rate of 0.1 nm/s and the thickness of 10 nm and then $\alpha$-NPD at the deposition rate of 0.1 nm/s and the thickness of 10 nm.

As the light-emitting layer, Alq3 is formed at the deposition rate of 0.1 nm/s and the thickness of 50 nm. Then on top of Alq3, Al—Li alloy (Li: 0.5 wt. %) is deposited at the deposition rate of 0.02 nm/s and the thickness of 50 nm, forming the organic EL device according to the first example. When applying to this device a voltage no less than 6 volts with ITO as the anode and Al—Li as the cathode, a green-color light emission was observed.

A First Comparative Example

The organic EL device according to the first comparative example is formed in the same manner as the first example except that 2-TNATA as the hole-injecting layer is deposited at the deposition rate of 0.5 nm/s and the thickness of 130 nm and $\alpha$-NPD layer in lieu of the electron-transporting suppressing stack is formed at the deposition rate of 0.1 nm/s and the thickness of 20 nm.

A Second Comparative Example

The organic EL device according to the second comparative example is formed in the same manner as the first example except that 2-TNATA as the hole-injecting layer is deposited at the deposition rate of 0.5 nm/s and the thickness of 10 nm, 2-TNATA and F4-TCNQ are simultaneously deposited on top of the hole-injecting layer as described above at the respective deposition rates of 0.5 nm/s and 0.0005 nm/s and the respective thicknesses of 120 nm, and $\alpha$-NPD layer in lieu of the electron-transporting suppressing stack is formed at the deposition rate of 0.1 nm/s and the thickness of 20 nm.

A Third Comparative Example

The organic EL device according to the third comparative example is formed in the same manner as the first example except that a $\alpha$-NPD layer in lieu of the electron-transporting suppressing stack is formed at the deposition rate of 0.1 nm/s and the thickness of 20 nm.

FIG. 7 is a table illustrating the layer configuration of specific elements of the organic EL devices according to the first example, and first through third comparative examples. Referring to FIG. 7, it may be understood that the light-emitting efficiency of the organic EL device of the first example is high relative to the organic EL devices of the first to the third comparative examples. It may be understood that the organic EL device of the first example has not only the light-emitting luminance lower than the second and third comparative examples, but also the current density suppressed so that the light-emitting efficiency is enhanced. It may be deduced that the electron-transporting stack consisting of $\alpha$-NPD and 2-NATA (with the difference in the electron affinities of 0.23 eV) reduces the amount of electron current to the electron-transporting suppressing layer from the light-emitting layer so that while the light-emitting luminance decreases, the probability of rebonding with the holes by the electrons enclosed in the light-emitting layer is increased, enhancing the light-emitting efficiency.

A Second Embodiment

Figure 8:
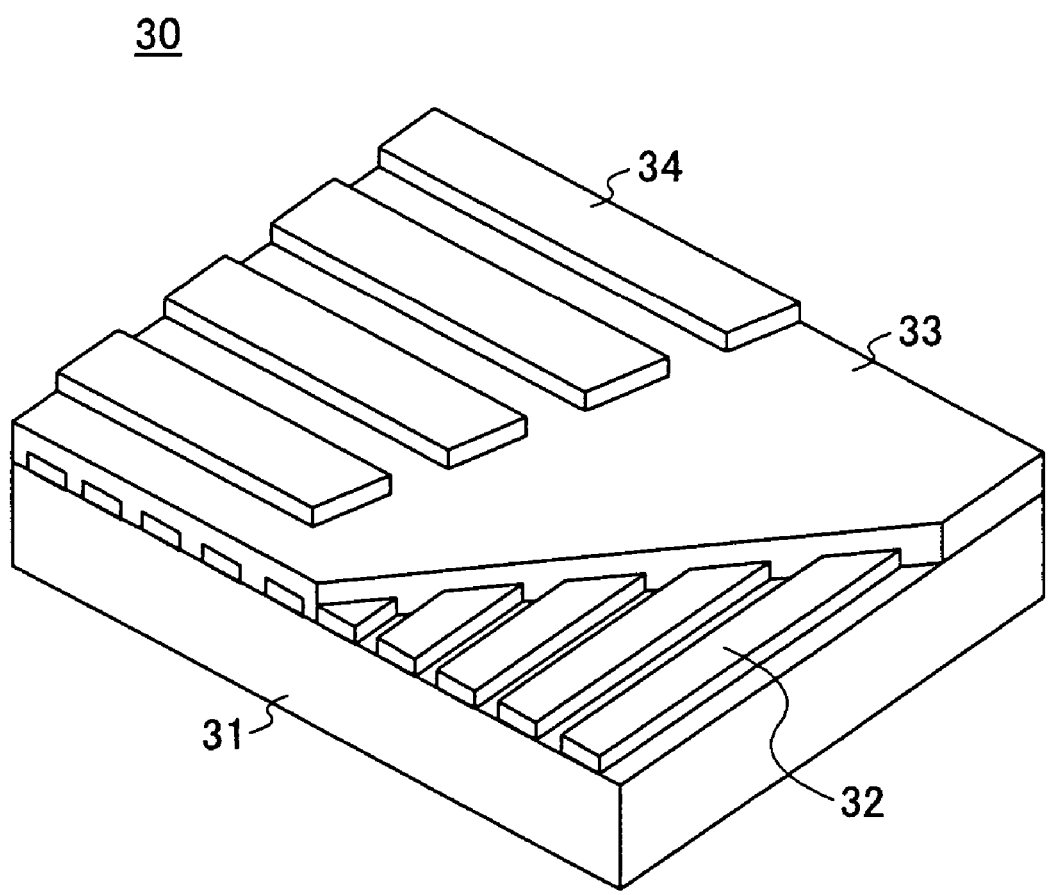
FIG. 8 is an exploded perspective view of the organic EL display according to a second embodiment of the present invention.

FIG. 8 is an exploded perspective view of the organic EL display according to the second embodiment of the present invention. Referring to FIG. 8, an organic EL display 30 is configured with a glass substrate 31, and a cathode 32 formed on the glass substrate in a stripe shape, an anode 34 formed vertically opposing the cathode 31 in a stripe shape, and a stack 33, etc., formed between the cathode 32 and the anode 34. Moreover, the organic EL display 30 is configured with a drive circuit (not illustrated) for driving a voltage to be applied between the cathode and the anode, and an encapsulated container, etc., for preventing exposure to moisture.

In the organic EL display 30 a voltage is applied to the cathode 32 and the anode 34 of a desired region causing emitting light in the desired region. The feature of the organic EL display is that the organic EL device consisting of the anode 34, the stack 33 and the cathode 32 is composed from the organic EL device according to the first or second embodiment as described above. Thus, an organic EL display having a high light-emitting efficiency and a long service life is implemented.

While preferable embodiments of the present invention have been described in detail, the present invention is not limited to the embodiments so that variations and changes are possible within the scope of the present invention.

For example, in the present embodiment, the organic EL device may be formed on the substrate by sequentially stacking from the anode side or from the cathode side.

What is claimed is:

1. An organic electroluminescence device, comprising:
   an anode;
   a cathode formed above said anode;

a light-emitting layer containing an organic light-emitting material that is formed between said anode and the cathode;

a hole-injecting layer on the anode that includes a hole-transporting material and an acceptor;

an electron-transporting suppressing stack between the hole-injecting layer and the light-emitting layer;

wherein the electron-transporting suppressing stack consists of a plurality of carrier-transporting layers, and forms energy barriers relative to electrons flowing from the light-emitting layer to the hole-injecting layer, and wherein said electron-transporting suppressing stack has arranged a first carrier-transporting layer bordering the anode side of the light-emitting layer and a second carrier-transporting layer bordering the anode side of said first carrier-transporting layer alternating repeatedly in said sequential order, and wherein an electron affinity of the first carrier-transporting layer and an electron affinity of the second carrier-transporting layer have a relationship in an equation (1) represented as $$E_{aHT1} > E_{aHT2} \tag{1}$$

where in the equation (1) $E_{aHT1}$ is the electron affinity of the first carrier-transporting layer and $E_{aHT2}$ is the electron affinity of the second carrier-transporting layer.

2. The organic electroluminescence device as claimed in claim 1, wherein the electron affinity of the first carrier-transporting layer and an electron affinity of the light-emitting layer have a relationship in an equation (2) represented as $$E_{aHT1} < E_{aEM} \tag{2}$$

where in the equation (2) $E_{aHT1}$ is the electron affinity of the first carrier-transporting layer and $E_{aEM}$ is the electron affinity of the light-emitting layer.

3. The organic electroluminescence device as claimed in claim 1, wherein the electron affinity of the first carrier-transporting layer or the second carrier-transporting layer that faces the cathode side of said hole-injecting layer, and an electron affinity of the hole-injecting layer have a relationship in an equation (3) represented as $$E_{aHT} > E_{aHI} \tag{3}$$

where in the equation (3) $E_{aHT}$ is the electron affinity of the first or the second carrier-transporting layer that faces the cathode side of said hole-injecting layer and $E_{aHI}$ is the electron affinity of the hole-injecting layer.

4. The organic electroluminescence device as claimed in claim 1, further comprising an electron-transporting layer between said light-emitting layer and the cathode, wherein an ionizing potential of said electron-transporting layer and an ionizing potential of said light-emitting layer have a relationship in an equation (4) represented as $$I_{pEM} < I_{pET} \tag{4}$$

where in the equation (4) $I_{pEM}$ is the ionizing potential of the light-emitting layer and $I_{pET}$ is the ionizing potential of the electron-transporting layer.

5. The organic electroluminescence device as claimed in claim 1, wherein the first carrier-transporting layer is as thick as or thicker than the second carrier-transporting layer.

6. The organic electroluminescence device as claimed in claim 1, wherein a thickness of the first carrier-transporting layer and a thickness of the second carrier-transporting layer are in a range of 2 nm to 50 nm.

7. The organic electroluminescence device as claimed in claim 1, wherein a content of the acceptor in the hole-injecting layer is in a range of 0.05 vol. % to 2 vol. %.

8. The organic electroluminescence device as claimed in claim 1, wherein either one of said first carrier-transporting layer and said second carrier-transporting layer is made of the same material as the hole-transporting material of said hole-injecting layer.

9. The organic electroluminescence device as claimed in claim 1, wherein said electron-transporting suppressing stack further includes a third carrier-transporting layer, and has arranged the first carrier-transporting layer, the second carrier-transporting layer, and the third carrier-transporting layer repeating systematically.

10. The organic electroluminescence device as claimed in claim 9, wherein said electron-transporting suppressing stack has arranged the first carrier-transporting layer bordering the anode side of the light-emitting layer, the second carrier-transporting layer bordering the anode side of said first carrier-transporting layer, the third carrier-transporting layer bordering the anode side of said second carrier-transporting layer, and a further first carrier-transporting layer bordering the anode side of said third carrier-transporting layer, and wherein an electron affinity of said first carrier-transporting layer and said further first carrier-transporting layer, an electron affinity of said second carrier-transporting layer, and an electron affinity of said third carrier-transporting layer have a relationship in an equation (5) represented as $$E_{aHT1} > E_{aHT2} > E_{aHT3} \tag{5}$$

where in the equation (5) $E_{aHT1}$ is the electron affinity of said first carrier-transporting layer, and said further first carrier-transporting layer, $E_{aHT2}$ is the electron affinity of said second carrier-transporting layer, and $E_{aHT3}$ is the electron affinity of said third carrier-transporting layer.

11. The organic electroluminescence device as claimed in claim 1, further comprising a further hole-injecting layer between said anode and the hole-injecting layer, wherein said further hole-injecting layer is made of a hole-transporting material.

12. An organic electroluminescence display, comprising the electroluminescence device as claimed in claim 1.

* * * * *